(12) United States Patent
Park et al.

(10) Patent No.: US 9,829,735 B2
(45) Date of Patent: Nov. 28, 2017

(54) DISPLAY DEVICE

(71) Applicant: Samsung Display Co., Ltd, Yongin, Gyeonggi-do (KR)

(72) Inventors: Seung Hyun Park, Yongin (KR); Jun Ho Song, Yongin (KR); Jean Ho Song, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/040,909

(22) Filed: Feb. 10, 2016

(65) Prior Publication Data

US 2016/0299385 A1 Oct. 13, 2016

(30) Foreign Application Priority Data

Apr. 10, 2015 (KR) .................. 10-2015-0051079

(51) Int. Cl.
*G02F 1/1333* (2006.01)
*H01L 27/12* (2006.01)
(Continued)

(52) U.S. Cl.
CPC .... *G02F 1/13338* (2013.01); *G02F 1/134363* (2013.01); *G06F 3/044* (2013.01);
(Continued)

(58) Field of Classification Search
CPC ........... G02F 1/13338; G02F 1/134363; G02F 1/133707; G02F 2001/13606;
(Continued)

(56) References Cited

U.S. PATENT DOCUMENTS 8,451,244 B2   5/2013  Hotelling et al.
2007/0268243 A1* 11/2007  Choo .................. G02F 1/13338
                                                    345/104
(Continued)

FOREIGN PATENT DOCUMENTS

KR   10-2013-0015126 A   2/2013
KR   10-2013-0020485 A   2/2013
(Continued)

*Primary Examiner* — Michael Caley
*Assistant Examiner* — Mariam Qureshi
(74) *Attorney, Agent, or Firm* — Innovation Counsel LLP

(57) ABSTRACT

There is provided a display device including a first substrate, a second substrate facing the first substrate, a display layer disposed between the first and the second substrates, a light blocking pattern, and a sensing line. The first substrate may include a thin film transistor (TFT) disposed on a base substrate, a first passivation layer disposed on the TFT, a color filter disposed on the first passivation layer, and a second passivation layer disposed on the color filter. The display layer may include a first electrode disposed on the second passivation layer, a third passivation layer disposed on the first electrode, a second electrode disposed on the third passivation layer and connected to the TFT, and an optical layer disposed between the first and the second substrates. The light blocking pattern may be disposed on the third passivation layer. The sensing line may be disposed on the light blocking pattern.

16 Claims, 5 Drawing Sheets

(51) Int. Cl.
*G02F 1/1343* (2006.01)
*G06F 3/041* (2006.01)
*G06F 3/044* (2006.01)
*G02F 1/1335* (2006.01)
*G02F 1/1337* (2006.01)
*G02F 1/136* (2006.01)
*G02F 1/1362* (2006.01)

(52) U.S. Cl.
CPC .......... *G06F 3/0412* (2013.01); *H01L 27/124* (2013.01); *G02F 1/133512* (2013.01); *G02F 1/133707* (2013.01); *G02F 2001/13606* (2013.01); *G02F 2001/136222* (2013.01); *G06F 2203/04103* (2013.01)

(58) Field of Classification Search
CPC ... G02F 1/133512; G02F 2001/136222; G06F 3/044; G06F 3/0412; G06F 2203/04103; H01L 27/124
See application file for complete search history.

(56) References Cited

U.S. PATENT DOCUMENTS

| | | | |
|---|---|---|---|
| 2011/0157039 A1* | 6/2011 | Shin | G02F 1/13338 345/173 |
| 2013/0265244 A1* | 10/2013 | Kim | G06F 3/044 345/173 |
| 2013/0321296 A1 | 12/2013 | Lee et al. | |
| 2013/0342498 A1 | 12/2013 | Kim et al. | |
| 2015/0301650 A1* | 10/2015 | Lee | G06F 3/044 345/174 |

FOREIGN PATENT DOCUMENTS

| | | |
|---|---|---|
| KR | 10-1315227 B1 | 9/2013 |
| KR | 10-2013-0143334 | 12/2013 |
| KR | 10-2014-0085994 A | 7/2014 |
| KR | 10-2014-0087531 A | 7/2014 |
| KR | 10-2014-0099139 A | 8/2014 |
| KR | 10-2014-0099164 A | 8/2014 |
| KR | 10-2014-0103025 A | 8/2014 |

* cited by examiner

DISPLAY DEVICE

CROSS-REFERENCE TO RELATED APPLICATION

This application claims priority to and the benefit of Korean Patent Application No. 10-2015-0051079, filed on Apr. 10, 2015, in the Korean Intellectual Property Office, the entire contents of which are incorporated herein by reference in their entirety.

BACKGROUND

1. Field

The present disclosure relates to a display device.

2. Description of the Related Art

A touch screen is a type of input device with which a user may input information by pressing or touching an area of the touch screen where one or more touch sensors are disposed. The touch screen may be installed in a display panel.

Recently, a touch screen is configured within a display panel to reduce a thickness of portable devices, such as smartphones or tablet PCs. In particular, an in-cell type of touch screen-integrated display device in which devices constituting a touch screen are disposed within a cell of a display panel has been developed.

SUMMARY

An embodiment of the present disclosure relates to a touch screen-integrated display device in which devices constituting a touch screen are disposed within a cell.

A display device according to an embodiment of the present disclosure includes a first substrate, a second substrate facing the first substrate, a display layer disposed between the first substrate and the second substrate, a light blocking pattern, and a sensing line. The first substrate may include a thin film transistor (TFT) disposed on a base substrate in a pixel area, a first passivation layer disposed on the TFT, a color filter disposed on the first passivation layer, and a second passivation layer disposed on the color filter. The display layer may include a first electrode disposed on the second passivation layer, a third passivation layer disposed on the first electrode, a second electrode disposed on the third passivation layer in the pixel area and connected to the TFT through a first contact hole, and an optical layer that allows light to be transmitted therethrough or blocks light according to an electric field formed between the first electrode and the second electrode, and disposed between the first substrate and the second substrate. The light blocking pattern may be disposed on an outer side of the pixel area on the third passivation layer, and the sensing line may be disposed on the light blocking pattern and connected to the first electrode through a second contact hole. The TFT may be connected to a data line and a gate line, the sensing line may be parallel to the gate line, and at least a portion of the sensing line may overlap the gate line.

The TFT may be connected to the gate line and the data line, the light blocking pattern may include a first light blocking pattern parallel to the gate line and a second light blocking pattern parallel to the data line, and the sensing line may include a first line disposed on the first light blocking pattern and parallel to the gate line and a second line disposed on the second light blocking pattern and parallel to the data line. Here, at least a portion of the first line may overlap the gate line, and at least a portion of the second line may overlap the data line.

The TFT may include a gate electrode, a semiconductor layer, a gate insulating layer disposed between the gate electrode and the semiconductor layer, and a source electrode and a drain electrode, and the gate insulating layer, the first passivation layer, and the third passivation layer may include at least one of a silicon oxide and a silicon nitride. The color filter, the second passivation layer, and the light blocking pattern may include an organic material.

The first electrode may be a common electrode to which a common voltage is applied, and may be a sensing electrode to which a touch scan signal is input through the sensing line.

The first electrode and the second electrode may include a transparent conductive oxide.

A display device according to another embodiment of the present disclosure includes: a gate electrode disposed on a base substrate including a pixel area and connected to a gate line; a gate insulating layer disposed on the gate line and the gate electrode; a semiconductor layer disposed on the gate insulating layer and overlapping the gate electrode in at least a portion thereof; a source electrode connected to one end of the semiconductor layer and a data line; a drain electrode connected to another end of the semiconductor layer and disposed to be spaced apart from the source electrode; a first passivation layer covering the source electrode and the drain electrode; a color filter disposed on the first passivation layer; a second passivation layer disposed on the color filter; a common electrode disposed on the second passivation layer; a third passivation layer disposed on the common electrode; a pixel electrode disposed on the third passivation layer within the pixel area and connected to the drain electrode; a light blocking pattern disposed on an outer side of the pixel area and parallel to at least one of the gate line and the data line; a sensing line disposed on the light blocking pattern and connected to the common electrode through a contact hole; a counter substrate facing the base substrate; and a liquid crystal layer disposed between the pixel electrode and the counter substrate.

In a display device according to an exemplary embodiment of the present disclosure, the device forming a touch screen may be provided within a display panel. Also, one of the electrodes of the display device serves as a sensing electrode so that the display device may have a reduced thickness.

BRIEF DESCRIPTION OF THE DRAWINGS

Example embodiments are described more fully hereinafter with reference to the accompanying drawings. However, the present system and method may be embodied in different forms and should not be construed as limited to the embodiments set forth herein. Rather, these embodiments are provided to help those of ordinary skill in the art understand and appreciate the teachings disclosed herein.

In the drawings, the dimensions of the figures may be exaggerated for clarity of illustration. It is understood that when an element is referred to as being "between" two elements, it may be the only element between the two elements, or one or more intervening elements may also be present. Like reference numerals refer to like elements throughout.

DETAILED DESCRIPTION

Hereinafter, embodiments of the present disclosure are described in detail with reference to the accompanying drawings.

Figure 1:
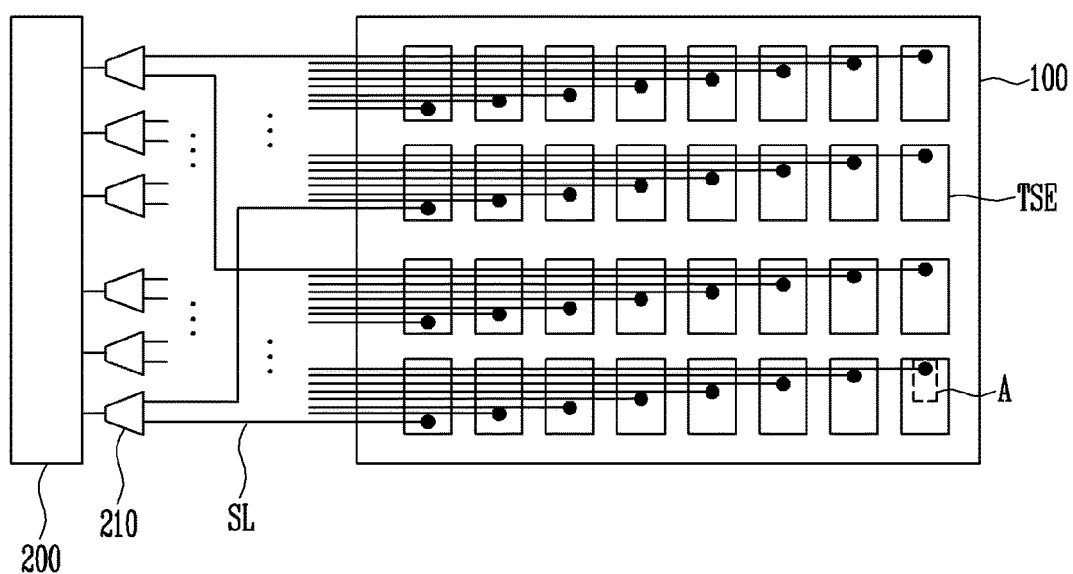
FIG. 1 is a plan view illustrating a display device according to an embodiment of the present disclosure.

FIG. 1 is a plan view illustrating a display device according to an embodiment of the present disclosure.

Referring to FIG. 1, a display device may include a display panel 100 and a touch driving unit 200.

The display panel 100 may include a touch screen (not shown), and the touch screen may sense a user's touch position. The display panel 100 may include a first substrate (not shown), a second substrate (not shown), and a display device (not shown) disposed between the first substrate and the second substrate. One of the first substrate and the second substrate may include a gate line, a data line intersecting the gate line, and at least one thin film transistor (TFT).

The display device may be connected to the TFT. The display device may be any one of a liquid crystal display (LCD) device, an electrophoretic display (EPD) device, an electrowetting display device (EWD) device, and an organic light emitting display (OLED) device. For the purposes of description, in this embodiment, an LCD device is described as an example of the display device. Also, although not shown, the display device may display an image using light provided from a backlight unit.

Also, the display panel 100 may include a plurality of sensing electrodes TSE and a plurality of sensing lines SL. The sensing electrodes TSE may operate as common electrodes for driving a liquid crystal layer together with pixel electrodes (not shown) disposed in pixel areas when a common voltage is applied to drive the display panel 100. Also, the sensing electrodes TSE may operate as sensing electrodes for sensing a touch position when a touch scan signal is applied to sense a touch. The sensing electrodes TSE may overlap a plurality of pixel areas.

The sensing lines SL connect the sensing electrodes TSE to a touch driving unit 200. For example, a touch scan signal applied from the touch driving unit 200 may be transferred to the sensing electrodes TSE, and a change in capacitance received from the sensing electrodes TSE may be transferred to the touch driving unit 200.

The touch driving unit 200 generates a touch scan signal that is supplied to the sensing electrodes TSE to sense a touch from the sensing electrodes TSE. A switching unit 210 disposed between the touch driving unit 200 and the display panel 100 may switch the touch scan signal and transmit the touch scan signal to the sensing electrodes TSE of the display panel 100.

Figure 2:
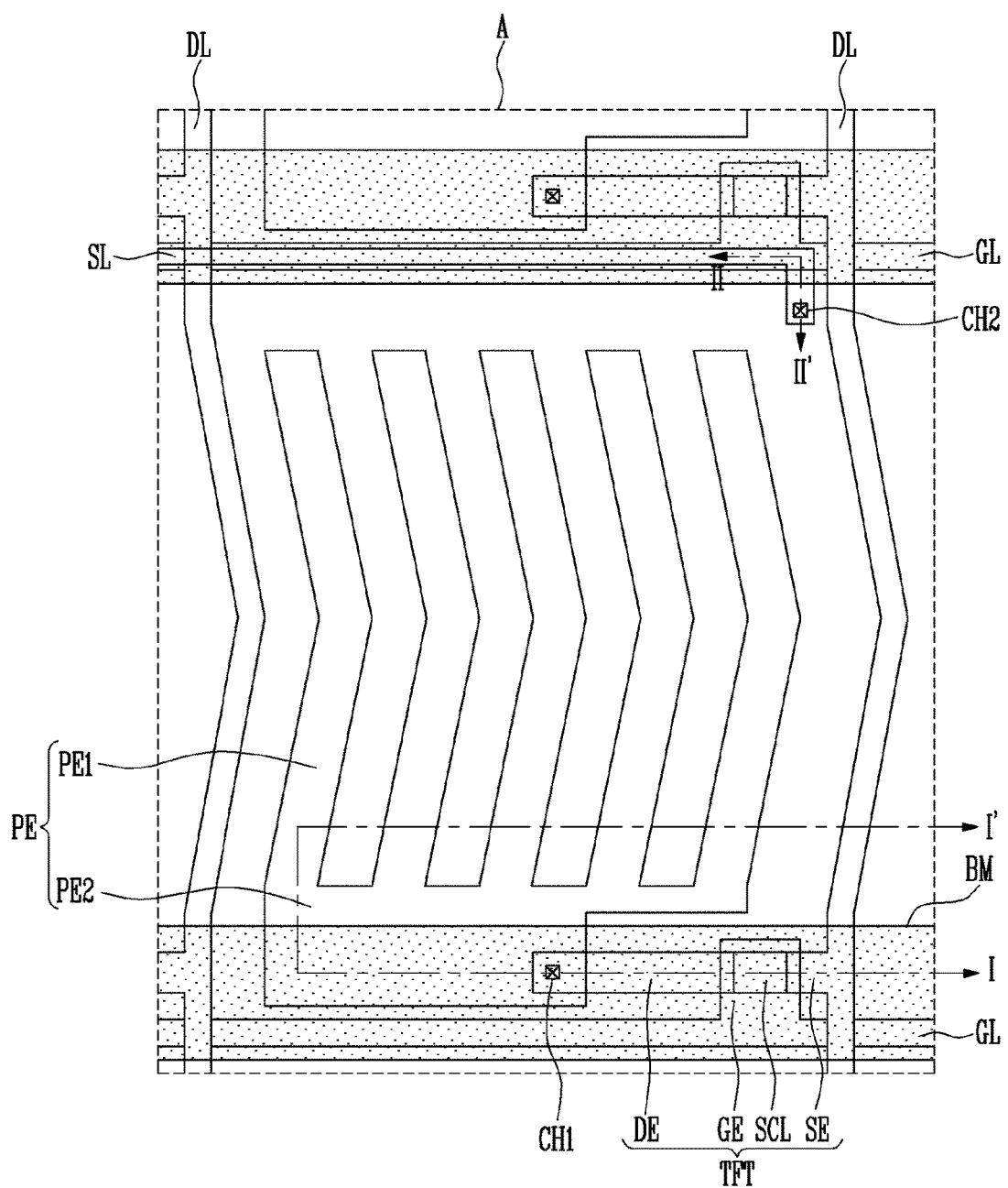
FIG. 2 is a partially enlarged plan view of a display panel illustrated in FIG. 1.
Figure 3:
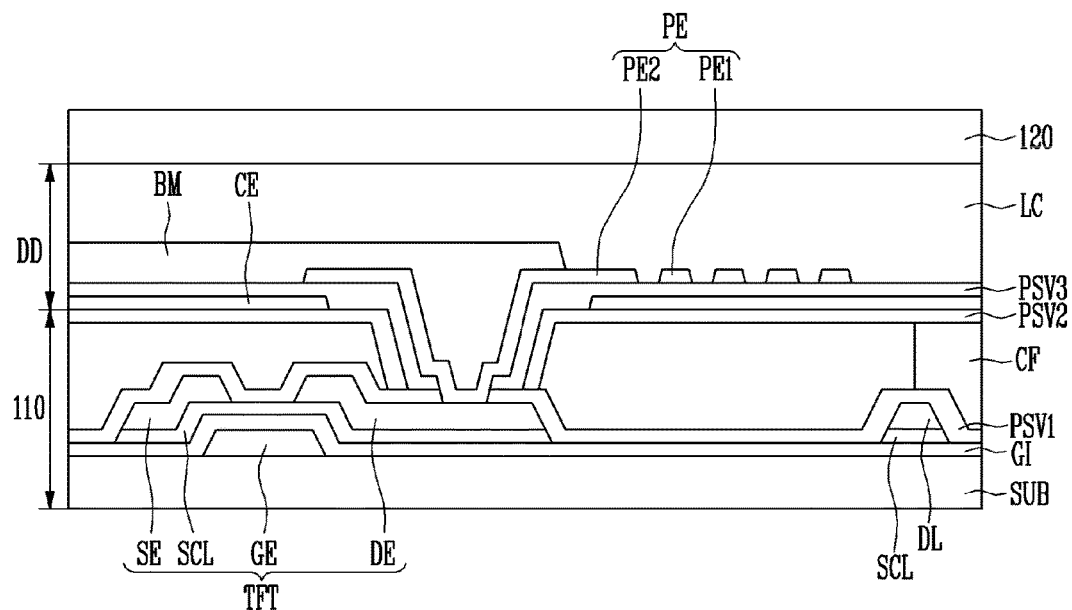
FIG. 3 is a cross-sectional view taken along line I-I' of FIG. 2.
Figure 4:
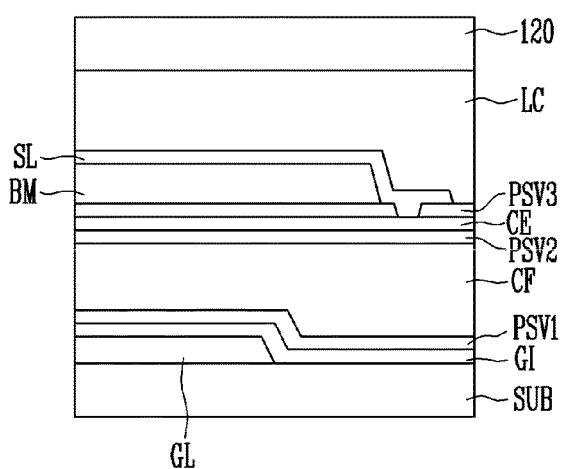
FIG. 4 is a cross-sectional view taken along line II-IF of FIG. 2.

FIG. 2 is a partially enlarged plan view of the display panel illustrated in FIG. 1. FIG. 3 is a cross-sectional view taken along line I-I' of FIG. 2. FIG. 4 is a cross-sectional view taken along line II-II' of FIG. 2.

Referring to FIGS. 2 through 4, the display panel 100 may include a first substrate 110, a second substrate 120 facing the first substrate 110, and a display device DD disposed between the first substrate 110 and the second substrate 120.

The first substrate 110 may include a base substrate SUB having a pixel area and at least one thin film transistor (TFT) disposed on the base substrate SUB in the pixel area. The TFT may be connected to the display device DD.

The base substrate SUB may include a transparent insulating material allowing light transmission. Also, the base substrate SUB may be a rigid substrate or a flexible substrate. The rigid substrate may include a glass substrate, a quartz substrate, a glass ceramic substrate, and a crystalline glass substrate. The flexible substrate may include a film substrate and a plastic substrate including a polymer organic substance. A material employed in the base substrate SUB may have resistance (or heat resistance) to a high treatment temperature during a manufacturing process.

The TFT may be connected to the gate line GL and the data line DL. Also, the TFT may include a gate electrode GE, a semiconductor layer SCL, a source electrode SE, and a drain electrode DE.

The gate electrode GE may be disposed on the base substrate SUB. Also, the gate electrode GE may be connected to the gate line GL. Also, an insulating layer (not shown) may be disposed between the gate line GL and the gate electrode GE and the base substrate SUB.

A gate insulting layer GI is disposed on the gate line GL and the gate electrode GE to insulate the gate electrode GE and the semiconductor layer SCL. That is, the gate insulating layer GI may be disposed between the gate line GL and the gate electrode GE and the semiconductor layer SCL. The gate insulating layer GI may include at least one of a silicon oxide (SiOx) and a silicon nitride (SiNx). For example, the gate insulating layer GI may have a structure in which the silicon oxide layer and the silicon nitride layer are stacked.

The semiconductor layer SCL may be disposed on the gate insulating layer GI and at least a portion of the semiconductor layer SCL may become a gate electrode. The semiconductor layer SCL may include one of an amorphous silicon (a-Si), a polycrystalline silicon (p-Si), and an oxide semiconductor. Also, regions of the semiconductor layer SCL connected to the source electrode SE and the drain electrode DE may be a source region and a drain region in which an impurity is doped or implanted. A region between the source region and the drain region may be a channel region. Here, the oxide semiconductor may include at least one of Zn, In, Ga, Sn, and a mixture thereof. For example, the oxide semiconductor may include IGZO (Indium-Gallium-Zinc Oxide).

The source electrode SE may be connected to one end of the semiconductor layer SCL. Also, the source electrode SE may be connected to the data line DL. The drain electrode DE may be connected to another end of the semiconductor layer SCL and may be disposed to be spaced apart from the source electrode SE.

In the above, the TFT having a bottom gate structure in which the gate electrode GE of the TFT is positioned below the semiconductor layer SCL is described as an example, but the present disclosure is not limited thereto. For example, the TFT may be a TFT having a top gate structure in which the gate electrode GE is positioned above the semiconductor layer SCL.

A first passivation layer PSV1 may be disposed on the base substrate SUB in which the TFT is disposed. The first passivation layer PSV1 may cover the TFT. The first passivation layer PSV1 may include at least one of a silicon nitride and a silicon oxide. For example, the first passivation layer PSV1 may include a silicon nitride layer and a silicon oxide layer disposed on the silicon nitride layer.

A color filter (CF) may be disposed on the first passivation layer PSV1. The color filter CF may include an organic solvent including an organic insulating material and dye or pigment dispersed in the organic solvent to implement a color. Thus, the color filter CF may transmit incident light of a particular color. The color filter CF may have one of red, green, blue, cyan, magenta, and yellow colors. Also, the color filter CF may have a thickness of 2.0 to 2.5 µm.

A second passivation layer PSV2 may be disposed on the color filter CF. The second passivation layer PSV2 may include a transparent organic insulating material. For example, the second passivation layer PSV2 may include at least one of an acrylic resin, an epoxy resin, a phenolic resin, a polyamide resin, a polyimide resin, an unsaturated polyester resin, a polyphenylene ether resin, a polyphenylene sulfide resin, and a benzocyclobutene resin. Here, the second passivation layer PSV2 may have a thickness of 1.0 to 2.0 µm.

The display device DD may be disposed on the second passivation layer PSV2. The display device DD may include a first electrode CE disposed on the second passivation layer PSV2, a third passivation layer PSV3 disposed on the first electrode CE, a second electrode PE disposed on the third passivation layer PSV3 and connected to the drain electrode DE through a first contact hole CH1, and an optical layer LC that allows light to be transmitted or blocks light according to an electric field generated by the first electrode CE and the second electrode PE. Here, the optical layer LC may be a liquid crystal layer including a plurality of liquid crystal molecules. That is, the amount of light that is transmitted by the optical layer LC may vary according to the strength of an electric field generated by the first electrode CE and the second electrode PE.

The first electrode CE may include a transparent conductive oxide. For example, the first electrode CE may include one of indium tin oxide (ITO) and indium zinc oxide (IZO). A common voltage may be applied to the first electrode CE. Thus, the first electrode may operate as a common electrode driving the liquid crystal molecules together with the second electrode PE.

Also, the first electrode CE may serve as a sensing electrode TSE connected to the touch driving unit 200. That is, when a touch scan signal is applied, the first electrode CD may operate as a sensing electrode sensing a user's touch position.

The third passivation layer PSV3 may include the same material as that of the first passivation layer PSV1. For example, the third passivation layer PSV3 may include a silicon nitride layer and a silicon oxide layer disposed on the silicon nitride layer.

When a driving signal is applied through the TFT, the second electrode PE may operate as a pixel electrode, together with the first electrode CE, for driving the liquid crystal molecules. The second electrode PE may include the same material as that of the first electrode CE. That is, the second electrode PE may include one of ITO and IZO. Also, the second electrode PE may include a plurality of branch portions PE1 and a connection portion PE2 connecting the branch portions PE1. Here, the connection portion PE2 may be connected to the drain electrode DE.

A light blocking pattern BM may be disposed on a portion of the third passivation layer PSV3. The light blocking pattern BM may be disposed outside of the pixel area. The light blocking pattern BM may be parallel to the gate line GL.

A thickness of the light blocking pattern BM may range from 3.5 to 4.0 µm. The light blocking pattern BM may include a material capable of blocking light completely. For example, the light blocking pattern BM may include an organic solvent including an organic insulating material and a light blocking material dispersed in the organic solvent. The light blocking material may include at least one of carbon black, chromium, and a chromium oxide. Thus, a light blocking pattern BM interposed between adjacent pixel areas may prevent light output from the respective pixel areas from interfering with each other.

A sensing line SL may be disposed to be parallel to the gate line GL on the light blocking pattern BM. When a touch scan signal for sensing a touch is applied to the first electrode CE through the sensing line SL, the first electrode CE may operate as a touch electrode to sense a touch position.

At least a portion of the sensing line SL may overlap the gate line GL. A portion of the sensing line SL may protrude and may be connected to the first electrode CE through a second contact hole CH2. Thus, parasitic capacitor may be formed in a region in which the sensing line SL and gate line GL overlap. Parasitic capacitance, capacitance of the parasitic capacitor, may cause delay of a scan signal applied to the gate line GL. Also, the parasitic capacitance may cause a delay of a touch scan signal applied to the sensing line SL or a delay of a touch sensing signal transmitted through the sensing line SL. Thus, in the display panel 100, the parasitic capacitance due to the sensing line SL and the gate line GL should be minimized.

In this embodiment, the sensing line SL is displayed on the light blocking pattern BM. Thus, the gate insulating layer GI, the first passivation layer PSV1, the second passivation layer PSV2, the color filter CF, the third passivation layer PSV3, and the light blocking pattern BM may be disposed between the gate line GL and the sensing line SL. Here, the color filter CF, the second passivation layer PSV2, and the light blocking pattern BM may include an organic material. In general, thicknesses of the color filter CF, the second passivation layer PSV2, and the light blocking pattern BM may be greater than those of the gate insulating layer GI, the first passivation layer PSV1, and the third passivation layer PSV3 including an inorganic insulating material. Thus, the sensing line SL and the gate line GL may be spaced apart from one another by the gate insulating layer GI, the first passivation layer PSV1, the second passivation layer PSV2, the color filter CF, the third passivation layer PSV3, and the light blocking pattern BM by a degree to which the parasitic capacitance is minimized. That is, since capacitance is inversely proportional to a distance between two electrodes of the capacitor, the parasitic capacitance formed between the sensing line SL and the gate line GL may be minimized.

In this embodiment, although the display device DD is exemplarily described as having a structure in which the first electrode CE and the second electrode PE are disposed on the first substrate 110, and the optical layer LC is disposed between the second electrode CE and the second substrate 120, the present disclosure is not limited thereto. For example, the display device DD may have a structure in which the optical layer LC disposed between the first electrode CE and the second electrode PE. In such case, one of the first electrode CE and the second electrode (for example, the first electrode CE) may be disposed on the second substrate 120.

The second substrate 120 may be a counter substrate facing the first substrate 120 and may be attached to the first substrate 110 through a sealant (not shown). The second substrate 120 may include the same material as that of the first substrate 110.

Figure 5:
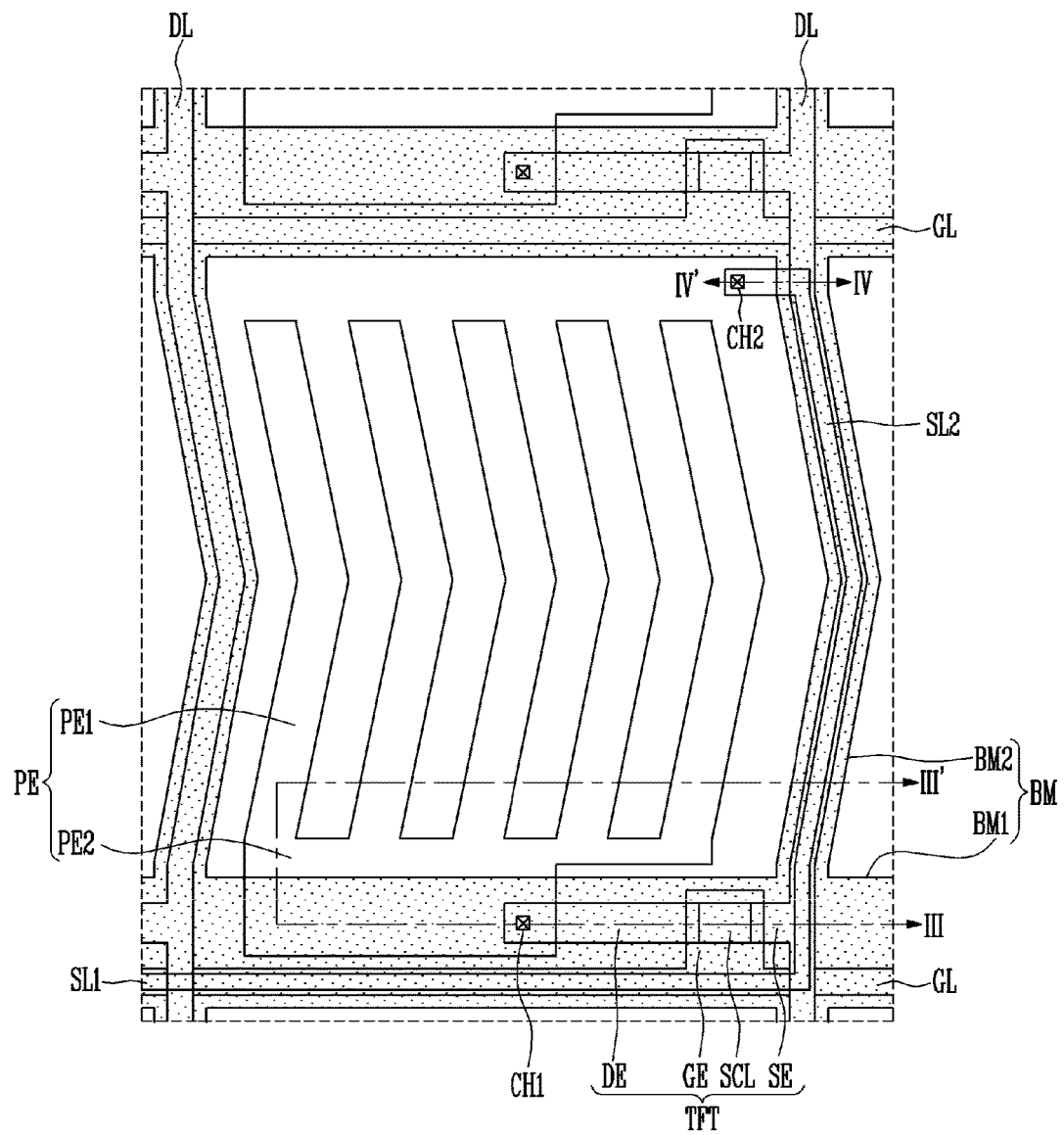
FIG. 5 is a partially enlarged plan view of a display panel according to another embodiment of the present disclosure.
Figure 6:
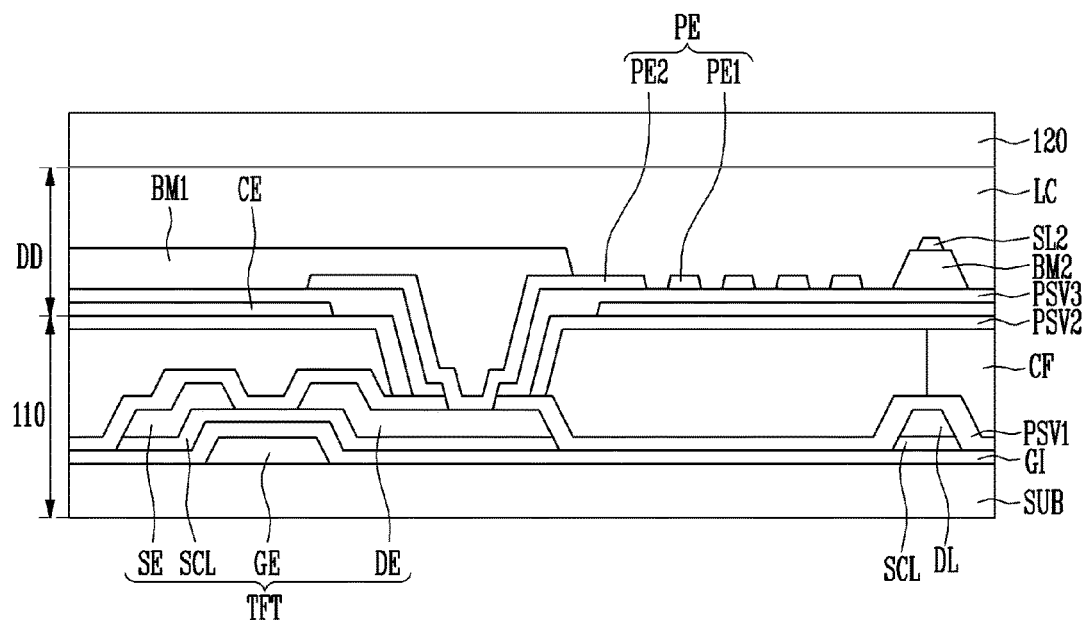
FIG. 6 is a cross-sectional view taken along line III-III' of FIG. 5.
Figure 7:
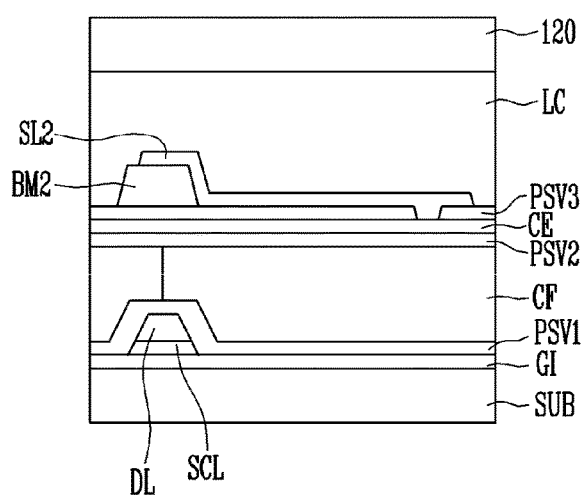
FIG. 7 is a cross-sectional view taken along line IV-IV' of FIG. 5.

Hereinafter, another embodiment of the present disclosure is described with reference to FIGS. 5 through 7. In FIGS. 5 through 7, the same reference numerals as those of the components illustrated in FIGS. 1 through 4 are used for the same components and are briefly described. In FIGS. 5 through 7, only differences from FIGS. 1 through 4 are described in order to avoid redundant descriptions.

FIG. 5 is a partially enlarged plan view of a display panel according to another embodiment of the present disclosure. FIG. 6 is a cross-sectional view taken along line III-III' of FIG. 5. FIG. 7 is a cross-sectional view taken along line IV-IV' of FIG. 5.

Referring to FIGS. 5 through 7, a display panel 100 may include a first substrate 110, a second substrate 120 facing the first substrate 110, and a display device DD disposed between the first substrate 110 and the second substrate 120.

The first substrate 110 may include a base substrate SUB and at least one thin film transistor (TFT) disposed on the base substrate SUB.

The TFT may be connected to a gate line GL and a data line DL. Also, the TFT may include a gate electrode GE, a semiconductor layer SCL, a source electrode SE, and a drain electrode DE.

A gate insulting layer GI is disposed on the gate line GL and the gate electrode GE and insulates the gate electrode GE and the semiconductor layer SCL.

A first passivation layer PSV1 may be disposed on the base substrate SUB in which the TFT is disposed, a color filter (CF) may be disposed on the first passivation layer PSV1, and a second passivation layer PSV2 may be disposed on the color filter CF.

The display device DD may be disposed on the second passivation layer PSV2. The display device DD may be connected to the drain electrode DE through a first contact hole CH1.

The display device DD may include a first electrode CE disposed on the second passivation layer PSV2, a third passivation layer PSV3 disposed on the first electrode CE, a second electrode PE disposed on the third passivation layer PSV3 and connected to the drain electrode DE through a first contact hole CH1, and an optical layer LC that allows light to be transmitted or blocks light according to an electric field generated by the first electrode CE and the second electrode PE. Here, the optical layer LC may be a liquid crystal layer including a plurality of liquid crystal molecules. That is, the amount of incident light transmitted by the optical layer LC may vary depending on the strength of the electric field generated by the first electrode CE and the second electrode PE.

A light blocking pattern BM may be disposed on a portion of the third passivation layer PSV3. The light blocking pattern BM may include a first light blocking pattern BM1 parallel to the gate line GL and a second light blocking pattern BM2 parallel to the data line DL. Thus, the first light blocking pattern BM1 and the second light blocking pattern BM2 may intersect each other.

A sensing line SL may be disposed on the light blocking pattern BM. The sensing line SL may include a first line SL1 disposed on the first light blocking pattern BM1 and parallel to the gate line GL and a second line SL2 disposed on the second light blocking pattern BM2 and parallel to the data line DL. Here, at least a portion of the first line SL1 may overlap the gate line GL. Also, at least a portion of the second line SL2 may overlap the data line DL. One end of the second line SL2 may be connected to the first electrode CE through a second contact hole CH2.

Thus, a parasitic capacitor may be formed in the region in which the first line SL1 and the gate line GL overlap and the region in which the second line SL2 and the data line DL overlap. Parasitic capacitance, capacitance of the parasitic capacitor, may cause delay of a scan signal applied to the gate line GL and a data signal applied to the data line DL. Also, the parasitic capacitance may cause a delay of a touch scan signal applied to the sensing line SL or a delay of a touch sensing signal transmitted through the sensing line SL. Thus, in the display panel, the parasitic capacitance due to the sensing line SL and the gate line GL should be minimized.

In this embodiment, the gate insulating layer GI, the first passivation layer PSV1, the second passivation layer PSV2, the color filter CF, the third passivation layer PSV3, and the light blocking pattern BM may be disposed between the gate line GL and the first line SL1. Also, the first passivation layer PSV1, the second passivation layer PSV2, the color filter CF, the third passivation layer PSV3, and the light blocking pattern BM may be disposed between the data line DL and the second line SL2.

Here, the color filter CF, the second passivation layer PSV2, and the light blocking pattern BM may include an organic material. In general, thicknesses of the color filter CF, the second passivation layer PSV2, and the light blocking pattern BM may be greater than those of the gate insulating layer GI, the first passivation layer PSV1, and the third passivation layer PSV3 including an inorganic insulating material. Thus, the first line SL1 and the gate line GL may be spaced apart from one another by the gate insulating layer GI, the first passivation layer PSV1, the second passivation layer PSV2, the color filter CF, the third passivation layer PSV3, and the light blocking pattern BM by a degree to which the parasitic capacitance is minimized. Also, the second line SL2 and the data line DL may be spaced apart from one another by the first passivation layer PSV1, the second passivation layer PSV2, the color filter CF, the third passivation layer PSV3, and the light blocking pattern BM by a degree to which the parasitic capacitance is minimized.

That is, since capacitance is inversely proportional to a distance between two electrodes of the capacitor, the parasitic capacitance formed between the sensing line SL and the gate line GL may be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, those of ordinary skill in the art would appreciate that various changes in form and details may be made without departing from the spirit and scope of the following claims.

What is claimed is:

1. A display device comprising:
    a first substrate including a thin film transistor (TFT) disposed on a base substrate in a pixel area, a first passivation layer disposed on the TFT, a color filter disposed on the first passivation layer, and a second passivation layer disposed on the color filter;
    a second substrate facing the first substrate;
    a display layer disposed between the first substrate and the second substrate, and including a first electrode disposed on the second passivation layer, a third passivation layer disposed on the first electrode, a second electrode disposed on the third passivation layer in the pixel area and connected to the TFT through a first contact hole, and an optical layer that allows light to be transmitted therethrough or blocks light according to an electric field formed between the first electrode and the second electrode, and;

a light blocking pattern disposed on an outer side of the pixel area on the third passivation layer; and a sensing line disposed on the light blocking pattern and connected to the first electrode through a second contact hole, wherein at least a portion of the sensing line is disposed with the light blocking pattern interposed between the TFT and the portion of the sensing line.

2. The display device of claim 1,
wherein the TFT is connected to a data line and a gate line, and
wherein the sensing line is parallel to the gate line and at least a portion of the sensing line overlaps the gate line.

3. The display device of claim 1,
wherein the TFT is connected to the gate line and the data line,
wherein the light blocking pattern includes a first light blocking pattern parallel to the gate line and a second light blocking pattern parallel to the data line, and
wherein the sensing line includes a first line disposed on the first light blocking pattern and parallel to the gate line and a second line disposed on the second light blocking pattern and parallel to the data line.

4. The display device of claim 3, wherein at least a portion of the first line overlaps the gate line and at least a portion of the second line overlaps the data line.

5. The display device of claim 1,
wherein the TFT includes a gate electrode, a semiconductor layer, a gate insulating layer disposed between the gate electrode and the semiconductor layer, and a source electrode and a drain electrode, and
wherein the gate insulating layer, the first passivation layer, and the third passivation layer include at least one of a silicon oxide and a silicon nitride.

6. The display device of claim 5, wherein the color filter, the second passivation layer, and the light blocking pattern include an organic material.

7. The display device of claim 1, wherein the first electrode is a common electrode to which a common voltage is applied, and is a sensing electrode to which a touch scan signal is input through the sensing line.

8. The display device of claim 1, wherein the first electrode and the second electrode include a transparent conductive oxide.

9. A display device comprising:
a gate electrode disposed on a base substrate including a pixel area and connected to a gate line;
a gate insulating layer disposed on the gate line and the gate electrode;
a semiconductor layer disposed on the gate insulating layer and overlapping the gate electrode in at least a portion thereof;
a source electrode connected to one end of the semiconductor layer and a data line;
a drain electrode connected to another end of the semiconductor layer and disposed to be spaced apart from the source electrode;
a first passivation layer covering the source electrode and the drain electrode;
a color filter disposed on the first passivation layer;
a second passivation layer disposed on the color filter;
a common electrode disposed on the second passivation layer;
a third passivation layer disposed on the common electrode;
a pixel electrode disposed on the third passivation layer within the pixel area and connected to the drain electrode;
a light blocking pattern disposed on an outer side of the pixel area and parallel to at least one of the gate line and the data line;
a sensing line disposed on the light blocking pattern and connected to the common electrode through a contact hole;
a counter substrate facing the base substrate; and
a liquid crystal layer disposed between the pixel electrode and the counter substrate, wherein at least a portion of the sensing line is disposed with the light blocking pattern interposed between the gate electrode and the portion of the sensing line.

10. The display device of claim 9, wherein the sensing line is parallel to the gate line, and at least a portion of the sensing line overlaps the gate line.

11. The display device of claim 9,
wherein the light blocking pattern includes a first light blocking pattern parallel to the gate line and a second light blocking pattern parallel to the data line, and
wherein the sensing line includes a first line disposed on the first light blocking pattern and parallel to the gate line and a second line disposed on the second light blocking pattern and parallel to the data line.

12. The display device of claim 11, wherein at least a portion of the first line overlaps the gate line, and at least a portion of the second line overlaps the data line.

13. The display device of claim 9, wherein the gate insulating layer, the first passivation layer, and the third passivation layer include at least one of a silicon oxide and a silicon nitride.

14. The display device of claim 13, wherein the color filter, the second passivation layer, and the light blocking pattern include an organic material.

15. The display device of claim 9, wherein the first electrode is a common electrode to which a common voltage is applied, and is a sensing electrode to which a touch scan signal is input through the sensing line.

16. The display device of claim 9, wherein the first electrode and the second electrode include a transparent conductive oxide.

* * * * *